United States Patent [19]

Gerard

[11] 4,423,386
[45] Dec. 27, 1983

[54] MULTISIGNAL AMPLIFICATION

[75] Inventor: Roger E. J. Gerard, Chelmsford, England

[73] Assignee: The Marconi Company Limited, Chelmsford, England

[21] Appl. No.: 201,264

[22] Filed: Oct. 27, 1980

[30] Foreign Application Priority Data

Nov. 7, 1979 [GB] United Kingdom ................ 7938628

[51] Int. Cl.$^3$ ............................................ H03F 3/60
[52] U.S. Cl. ....................................... 330/54; 330/126; 330/147
[58] Field of Search ......................... 330/54, 126, 147; 370/38; 455/103

[56] References Cited

U.S. PATENT DOCUMENTS 3,571,742  3/1971  Wengenruth ...................... 330/54

*Primary Examiner*—James B. Mullins
*Attorney, Agent, or Firm*—Spencer & Frank

[57] ABSTRACT

The present invention provides a modified distributed amplifier which is capable of accepting two or more independent inputs and amplifying them without giving rise to a large number of significant intermodulation products. This modified distributed amplifier effectively comprises two or more unmodified distributed amplifiers (as $V_{11}$ to $V_{18}$ and $V_{21}$ to $V_{28}$) joined so as to have a common output line (10) but individual, independent, input lines (111 and 211). The join is preferably "back-to-back" (in a parallel sense) so that the individual distributed amplifiers are in some sort of interleaved arrangement.

7 Claims, 2 Drawing Figures

MULTISIGNAL AMPLIFICATION

BACKGROUND OF THE INVENTION

(1) Field of the Invention

This invention relates to multisignal amplification, and concerns in particular the use of individual electronic amplification systems for the amplification of a multiplicity of independent electronic signals.

(2) Description of the Prior Art

For many applications it is desirable that a single electronic amplifier be used for the amplification of two or more signals, the individual signals not being connected with or related to each other in any way. A typical such application is in the field of high frequency radio transmission using wideband amplifiers (often of the distributed-amplifier type) feeding radio frequency power to a transmitting aerial for radiation. It is common for two or more quite unconnected signals to be fed to a single amplifier at the same time; an example is the use of a single such amplifier to be employed simultaneously to amplify, for transmission, two or more information-modulated carrier wave signals based upon carrier waves of quite different frequencies.

Amplification of any signal of the continuous wave type involves the generation of harmonics—that is, spurious signals of frequencies which are whole number multiples of the basic signal frequency (thus, twice, three times, four times and so on). For a single basic frequency these harmonics are reduced in power level to the point at which—in general—they can be ignored. However, the "combined" amplification of a number of signals of quite different basic frequencies inevitably gives rise not only to harmonics but also to the highly undesirable formation of what are known as "intermodulation products"—that is, extra spurious output signals related in some way to a combination of the basic input signals and their harmonics. By way of example, in the simple case where a signal of frequency $F_1$ is being amplified simultaneously with a signal of frequency $F_2$, there will be generated not only the harmonics $2F_1$, $3F_1$, $4F_1$ ... and $2F_2$, $3F_2$, $4F_2$ ... but also intermodulation products of the type $F_1 \pm F_2$, $2F_1 \pm F_2$, $3F_1 \pm 2F_2$, ... and so on. The problem is that there may be so many of these intermodulation product signals that they cause unacceptable interference to other signals over a very wide portion of the available radio spectrum.

The situation becomes very much worse as the number of independent basic signal frequencies increases. The number of combinations increases very rapidly as the number of signals increases; the number of possible significant intermodulation combinations for just six basic frequencies can be over a quarter of a million!

One type of amplifier commonly used as a wideband amplifier is that known as a distributed amplifier. For the purpose of this Specification a distributed amplifier may be defined as an amplifier wherein the parasitic capacitance(s) associated with the electrodes (or like operating structures) of the or each amplifying element in the amplifier is/are utilised to form part of input and output transmission lines across which the or each amplifying element is connected. Most commonly, a practical distributed amplifier has two or more individual amplifying elements (perhaps as many as eight), and such a practical distributed amplifier may be further defined as an amplifier in which a number of individual amplifying elements are arranged in parallel to take a control signal from one common input line and to feed an amplified signal to one common output line, the arrangement being such that the control signal arrives sequentially at each amplifier element, and such that all the individual outputs add in phase to give the maximum output. Each amplifying element thus contributes a part of the final output, which final output is effectively merely the sum of the individual parts.

Distributed amplifiers are well known, and various types used as wideband amplifiers are described in, for example, Marconi British Patent Specification No. 846,633 (corresponding to U.S. Pat. No. 3,129,387), and, more recently, in the Specification of Marconi Application for British Letters Patent No. 44,336/78 (corresponding to U.S. application Ser. No. 88,063 filed Oct. 24, 1979, and now U.S. Pat. No. 4,337,439). A basic distributed amplifier format is described hereinafter with reference to the schematic circuit diagram of FIG. 1 of the accompanying drawings.

SUMMARY OF THE INVENTION

The present invention seeks to provide a novel type of amplifier which is a modification of the distributed amplifier described above, and which is capable of accepting two or more independent inputs and amplifying them without giving rise to so large a number of significant intermodulation products as would the conventional version.

In one aspect, therefore, this invention provides a modified form of distributed amplifier which effectively comprises two or more unmodified distributed amplifiers joined so as to have a common output line but individual, independent, input lines.

The unmodified amplifiers can be joined "back-to-back" (this expression indicating that individual output lines of the separate unmodified distributed amplifiers are joined so as to be common in a parallel sense) or head-to-tail (this expression indicating that they are joined in a series sense). When the join is a back-to-back join the individual distributed amplifiers may be coupled in correspondence, or in some sort of interleaved arrangement. In some cases the individual amplifiers may be joined partly back-to-back and partly head-to-tail. The situation is described further hereinafter with reference to the accompanying drawings.

The unmodified distributed amplifiers employed in the amplifier of the invention, most conveniently, utilize two or more amplifying elements. Thus, in such a case the amplifier of the invention may, alternatively, be defined as:

an amplifier wherein there is a multiplicity of sets of individual amplifying elements;

the amplifying elements in each set are arranged in parallel to take a control signal from one common input line and to feed an amplified signal to one common output line, the arrangement being such that the control signal arrives sequentially at each amplifying element, and such that all the individual outputs add in phase to give the maximum output; and the sets themselves are arranged each to take its own control signal from its own input line but to feed its amplified output signal to one output line common to all the sets, the feed points of any one set in that common output line corresponding to, being interposed with, or following sequentially the feed points of any other set.

Details of preferred embodiments of the amplifier of the invention are given below. Here, however, it is appropriate to explain how the inventive amplifier enables there to be attained a reduction in intermodulation products.

From the brief explanation given above, it will be understood that intermodulation products arise because of the combinatory effects produced (while amplifying any two or more independent signals of different frequencies) between the basic signals and their harmonics. The actual point of generation of the intermodulation products is the amplifying element itself (they arise during the actual amplification, and are not caused simply upon summation of the basic signals), and it follows that a reduction in the number of independent signals fed to any one amplifying element must necessarily result in a reduction of the number of intermodulation products generated thereby.

The inventive amplifier allows a reduction in the number of independent signals fed to each amplifying element by including at least two distributed amplifiers each having its own individual input line but all sharing a common output line. At the very least, therefore, the number of independent signals fed to any one amplifying element—that is, to any one element of the set of such elements making up one distributed amplifier—can be halved, resulting in a reduction in the number of significant intermodulation products. Naturally, the larger the number of sets of amplifying elements (the larger the number of unmodified distributed amplifiers "combined" together) the smaller the number of independent signals (for any given total number of signals) that each set need take, and the smaller the number of significant intermodulation products. There will, however, be a balance between desirably reducing intermodulation products and undesirably increasing equipment complexity and cost; in general it is unlikely that there will be enough independent signals to warrant more than three sets of amplifying elements (three combined unmodified distributed amplifiers), and for most purposes two will be sufficient.

The set of amplifying elements making up each unmodified distributed amplifier may in itself be in any of the forms used or suggested for use as a distributed amplifier (as, for example, in our aforementioned U.S. Pat. No. 846,633 and application No. 44,336/78), and the invention is applicable both to single-ended and to push-pull amplifiers. The distributed amplifier will usually be of the thermionic valve type, and the invention is hereinafter described utilising thermionic valves, though it will be realised by those skilled in the art that suitable semiconductor devices may be substituted for valves (and in such a case any reference herein to "anode", "cathode" and "control electrode" or "grid", should be construed accordingly).

Though the unmodified distributed amplifiers used in the present invention can be joined head-to-tail, this may result in undesirable differences in amplification levels, and preferably they are joined back-to-back—that is, the feed points of one unmodified amplifier from its anodes out to the common output line either match, or are interposed with, the feed points of the others. This is perhaps best explained (as hereinafter) with reference to the accompanying drawings, but in the alternative it may be described as follows. Considering any one unmodified distributed amplifier, it can be seen that it comprises a set of individual amplifying elements (a first, a second, . . . a last) joined in parallel between a common input line and a common output line. Control signals travelling up the input line are fed off in turn to each amplifying element's control electrode, and in the same sequence the anode of each amplifying element is connected to the output line. In an inventive amplifier—for example, one with only two unmodified amplifiers in combination—each amplifying element in one unmodified amplifier is joined to the common output line either at the matching point (the point where there is connected the corresponding element of the other unmodified amplifier) or at such a point that the joining points of one unmodified amplifier are interposed in sequence with the joining points of the other. In this latter case the simplest (and preferred) situation is where the two sets of joining points are alternate—first of one, first of other, second of one, second of other, . . . last of one, last of other—but clearly all sorts of combinations are possible. Thus, the joining points could alternate in pairs (or some other grouping) rather than singly, or they could "alternate" in an irregular fashion. However: the most convenient types of unmodified distributed amplifier are those with a tapered impedance output line, and the common output line of the inventive amplifier is preferably of tapered impedance; it will normally be the case that the inventive amplifier be required to amplify equally all the signals fed to it; and to ensure in a simple manner equal amplification by each set of amplifier elements it is desirable that all of the elements within each group of corresponding elements—all the first ones, all the second ones, . . . all the last ones—be joined to the common output line at points which are essentially at the same position in the taper (thus, which are so arranged that any length of output line between them has no—or no significant—impedance). As stated above, such a condition is best met by having each of the sets of amplifying elements join the common output line at points which alternate (from one set to another) and are in sequence (are in the correct order corresponding to the order of the elements). Such an inventive amplifier may be regarded as a number of unmodified amplifiers "interleaved" with each other.

In a modification of this last-mentioned embodiment it may be convenient to have the unmodified amplifiers interleaved at the beginning—that is, for the first few amplifying elements to be interleaved—but matched at the end—that is, for the last few amplifying elements to be joined in correspondence.

BRIEF DESCRIPTION OF THE DRAWINGS

The invention will now be described, though by way of illustration only, with reference to the accompanying drawings, in which.

DETAILED DESCRIPTION

Figure 1:
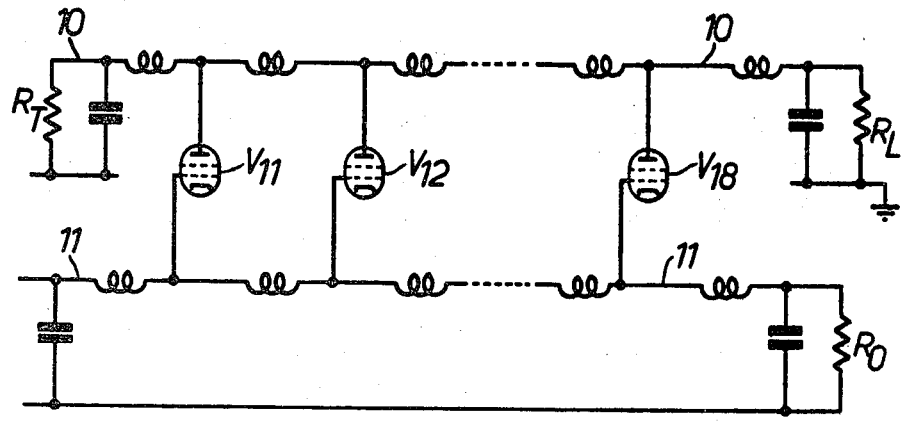
FIG. 1 shows a schematic circuit diagram of a conventional distributed amplifier format.

In the conventional distributed amplifier of FIG. 1, eight thermionic valves ($V_{11}$–$V_{18}$) are connected in a parallel sequence via their anodes to an output line (10) having at one end a terminating resistance $R_T$ and connected at the other end to a load impedance $R_L$. All the valves' control electrodes are connected in a parallel sequence to an input line (11) terminated by a load impedance $R_o$. The delay between each inter-valve output line section matches the delay of the relevant inter-valve input line section; thus, all the outputs are in step with all the inputs, and so the outputs combine in an acceptable manner.

Figure 2:
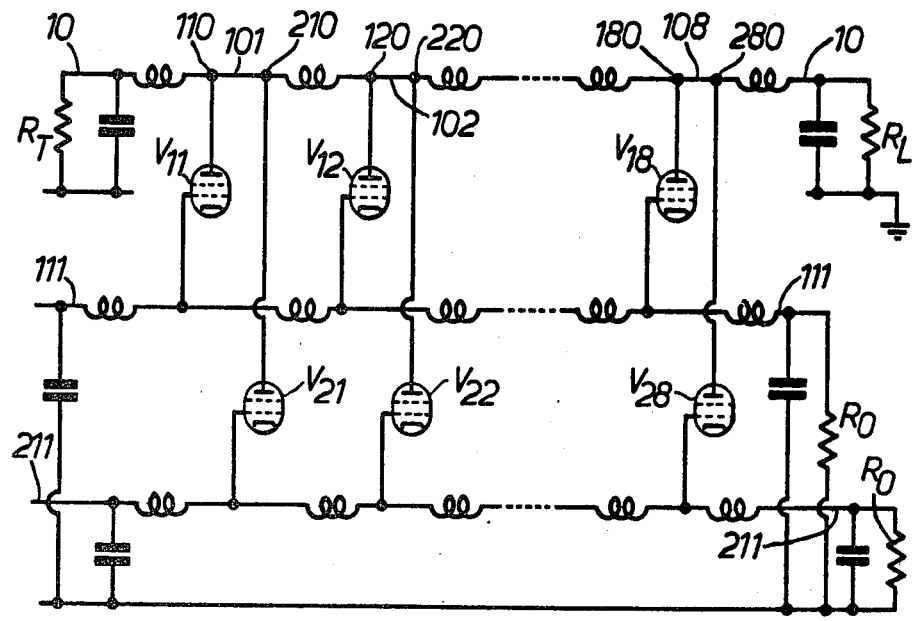
FIG. 2 shows a schematic circuit diagram of a modified distributed amplifier in accordance with the invention.

The distributed amplifier according to the invention (as shown in FIG. 2) is basically a combination of two amplifiers similar to that shown in FIG. 1.

There is a single output line 10, two input lines (111, 211), and two sets of eight valves ($V_{11}$–$V_{18}$ and $V_{21}$–$V_{28}$) so arranged that the $V_{11}$–$V_{18}$ set is connected in a parallel sequence between output line 10 and (one) input line 111 while the $V_{21}$–$V_{28}$ set is connected in a parallel sequence between output line 10 and (the other) input line 211. As can clearly be seen, the inventive amplifier is in essence two of the unmodified (FIG. 1) amplifiers joined back-to-back—thus, having a common output line to which the valves' anodes are joined in an interposed manner at feed points 110/210, 120/220, . . . and 180/280. If each pair of corresponding feed points (as 110/210) was actually joined to the same position on output line 10, or if the short length of line 10 (101, 102 . . . 108) between the two points is considered to have negligable impedance, then the feed points of one set of amplifiers correspond to those of the other set. If, however, the short intermediate lengths of line 10 (as 101) are considered to have a real, and substantial, impedance, then in this particular Figure the feed points are regularly and alternately interposed, and the two unmodified amplifiers may be regarded as being regularly interleaved one with the other.

I claim:

1. A modified distributed amplifier comprising:
at least two unmodified distributed amplifiers each having a separate input line and a plurality of amplifying elements connected to said separate input line, each said amplifying element having an output and all of said amplifying elements of both said unmodified amplifiers being configured substantially identically to one another, and said separate input lines being arranged to couple independent control signals to each of said unmodified amplifiers; a common output line connected to the output of each said amplifying element of said at least two unmodified amplifiers, the connection of said common output line to each said amplifying element of a respective one of said unmodified amplifiers being independent of the connections of said common output line to each said amplifying element of the others of said at least two unmodified amplifiers, wherein all the amplifying elements of each said unmodified amplifier are connected in parallel between said common output line and the associated separate input line.

2. An amplifier as claimed in claim 1, wherein said at least two unmodified distributed amplifiers include only two unmodified distributed amplifiers.

3. An amplifier as claimed in 1, wherein each said amplifying element is of the thermionic valve type.

4. An amplifier as claimed in claim 1, wherein said unmodified distributed amplifiers are joined back-to-back.

5. An amplifier as claimed in claim 4, wherein the amplifying elements of one said unmodified amplifier are connected to said common output line at points that are regularly interposed with connection points of the amplifying elements of the others of said at least two unmodified distributed amplifiers.

6. An amplifier as claimed in claim 1, wherein said common output line is connected directly to the output of each said amplifying element of said at least two unmodified amplifiers.

7. A modified distributed amplifier comprising:
a least two unmodified distributed amplifiers each having a separate input line and a plurality of amplifying elements connected to said separate input line, each said amplifying element having an output electrode and said separate input lines being arranged to couple independent control signals to each of said unmodified amplifiers;
a common output line connected directly to the output electrode of each said amplifying element of said at least two unmodified amplifiers, the connection of said common output line to each said amplifying element of a respective one of said unmodified amplifiers being independent of the connections of said common output line to each said amplifying element of the others of said at least two unmodified amplifiers, wherein all the amplifying elements of each said unmodified amplifier are connected in parallel between said common output line and the associated separate input line.

* * * * *